(12) United States Patent
Feng et al.

(10) Patent No.: US 7,675,378 B2
(45) Date of Patent: *Mar. 9, 2010

(54) MULTIPLE STATUS E-FUSE BASED NON-VOLATILE VOLTAGE CONTROL OSCILLATOR CONFIGURED FOR PROCESS VARIATION COMPENSATION, AN ASSOCIATED METHOD AND AN ASSOCIATED DESIGN STRUCTURE

(75) Inventors: Kai D. Feng, Hopewell Juction, NY (US); Kafai Lai, Poughkeepsie, NY (US); Ping-Chuan Wang, Hopewell Junction, NY (US); Zhijian J. Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

This patent is subject to a terminal disclaimer.

(21) Appl. No.: 12/114,029

(22) Filed: May 2, 2008

(65) Prior Publication Data
US 2009/0243739 A1 Oct. 1, 2009

Related U.S. Application Data

(63) Continuation of application No. 12/057,494, filed on Mar. 28, 2008.

(51) Int. Cl.
*H03B 5/12* (2006.01)
*H03L 7/099* (2006.01)
(52) U.S. Cl. .................. 331/177 V; 331/36 C
(58) Field of Classification Search .............. 331/1 A, 331/8, 10, 11, 16–18, 25, 35 C, 44, 175, 176, 331/177 R, 177 V, 179
See application file for complete search history.

(56) References Cited

U.S. PATENT DOCUMENTS

| 5,083,098 A | 1/1992 | Alidio et al. |
| 5,648,744 A | 7/1997 | Prakash et al. |
| 5,739,730 A | 4/1998 | Rotzoll |

(Continued)

OTHER PUBLICATIONS

Feng et al., U.S. Appl. No. 12/057,494, BUR920070245US1, filed Mar. 28, 2008, Ex Parte Quayle Action, Jun. 1, 2009, 4 pages.

*Primary Examiner*—David Mis
(74) *Attorney, Agent, or Firm*—Gibb I.P. Law Firm, LLC; W. Riyon Harding, Esq.

(57) ABSTRACT

Disclosed are embodiments of a voltage controlled oscillator (VCO) capable of non-volatile self-correction to compensate for process variations and to ensure that the center frequency of the oscillator is maintained within a predetermined frequency range. This VCO incorporates a pair of varactors connected in parallel to an inductor-capacitor (LC) tank circuit for outputting a periodic signal having a frequency that is proportional to an input voltage. A control loop uses a programmable variable resistance e-fuse to set a compensation voltage to be applied to the pair of varactors. By adjusting the compensation voltage, the capacitance of the pair of varactors can be adjusted in order to selectively increase or decrease the frequency of the periodic signal in response to a set input voltage and, thereby to bring the frequency of that periodic signal into the predetermined frequency range. Also disclosed are embodiments of an associated design structure for such a VCO and an associated method for operating such a VCO.

20 Claims, 6 Drawing Sheets

U.S. PATENT DOCUMENTS

| | | |
|---|---|---|
| 5,896,068 A | 4/1999 | Moyal |
| 6,469,587 B2 | 10/2002 | Scoggins |
| 6,671,221 B2 | 12/2003 | Beer et al. |
| 6,980,589 B1 | 12/2005 | Babb et al. |
| 7,053,683 B2 | 5/2006 | Li |
| 7,103,337 B2 | 9/2006 | Uozumi et al. |
| 7,263,340 B2 | 8/2007 | Uozumi et al. |
| 7,269,402 B2 | 9/2007 | Uozumi et al. |
| 7,493,229 B2 * | 2/2009 | Boerstler et al. ............ 702/132 |

* cited by examiner

Increasing Resistance By Creating Opens

Decreasing Resistance By Reverting Back To Shorts

MULTIPLE STATUS E-FUSE BASED NON-VOLATILE VOLTAGE CONTROL OSCILLATOR CONFIGURED FOR PROCESS VARIATION COMPENSATION, AN ASSOCIATED METHOD AND AN ASSOCIATED DESIGN STRUCTURE

CROSS REFERENCE TO RELATED APPLICATIONS

This application is a continuation of U.S. application Ser. No. 12/057,494 filed Mar. 28, 2008 and assigned to the present Assignee.

BACKGROUND OF THE INVENTION

The embodiments of the invention generally relate to the frequency range of voltage control oscillators (VCOs) and, more particularly, to a VCO configured with a control loop that incorporates variable resistance e-fuse(s) to selectively adjust the periodic output signal frequency to compensate the process variation. The embodiments also relate to an associated design structure for such a VCO and to an associated method for operating such a VCO.

DESCRIPTION OF THE RELATED ART

Process variations impact performance in all technologies. In voltage controlled oscillators (VCOs) such process variations can have a significant impact on operation frequency. Specifically, with continued device scaling, process variations can impact the operational frequency range of a VCO such that it is no longer within specification. Therefore, it would be advantageous to provide a VCO capable of non-volatile self-correction to compensate for process variations and, thereby to ensure that the center frequency is maintained within the predetermined frequency range.

BRIEF SUMMARY OF THE INVENTION

In view of the foregoing disclosed herein are embodiments of a voltage controlled oscillator (VCO) capable of non-volatile self-correction to compensate for process variations and, thereby to ensure that the center frequency of the VCO is maintained within a predetermined frequency range. Embodiments of this VCO incorporate a pair of varactors connected in parallel to an inductor-capacitor (LC) tank circuit for outputting a periodic signal having a frequency that varies as a function of an input voltage (e.g., increases with an increasing input voltage, decreases with a decreasing input voltage). The embodiments further incorporate a control loop. This control loop uses programmable variable resistance e-fuse(s) to set a compensation voltage to be applied to the pair of varactors. By adjusting the compensation voltage, the capacitance of the pair of varactors can be adjusted in order to selectively increase or decrease the frequency of the periodic signal in response to an input voltage and, thereby bring the frequency of that periodic signal into the predetermined frequency range.

More particularly, disclosed herein are embodiments of a voltage controlled oscillator (VCO). The VCO embodiments can comprise an inductor-capacitor (LC) tank adapted to receive a first voltage (i.e., a supplied input voltage in an operating mode or a predetermined tuning input voltage in a sensing mode) for controlling capacitance in the LC tank and at least one varactor connected in parallel with the LC tank and adapted to receive a second voltage (i.e., a compensation voltage) for controlling capacitance in the varactor(s).

The VCO embodiments can further comprise a VCO output node that is connected to the LC tank and the varactor(s) and that is adapted to output a periodic signal that is generated by the parallel connected LC tank and varactor(s). Thus, the frequency of the periodic signal at the VCO output node will be a function (e.g., an increase function) of the first voltage (i.e., the supplied or tuning input voltage) and, if necessary, can also be a function of a second voltage (i.e., a compensation voltage). An amplifier can be connected between the parallel connected LC tank and varactor(s) and the VCO output node and can be adapted to adjust (i.e., magnify) this periodic signal.

Additionally, the VCO embodiments can comprise a control loop between the VCO output node and the varactor(s). This control loop can be adapted to determine if the frequency of the periodic signal at the VCO output node in response to a set first voltage (i.e., a predetermined tuning input voltage) is outside a predetermined frequency range and, if necessary, can be adapted to bring that frequency back into the predetermined frequency range by determining the required second voltage (i.e., the required compensation voltage) and applying that second voltage to the varactor(s).

Specifically, the control loop can comprise a period detector connected to the VCO output node. This period detector can be adapted to determine the period of the periodic signal at the VCO output node and to convert that period into an output voltage. The control loop can further comprise a plurality of voltage comparators adapted to determine if the output voltage of the period detector is within a predetermined voltage range. For example, a first comparator can compare the output voltage of the period detector to the upper limit of the predetermined voltage range to determine if the frequency of the periodic signal at the VCO output node needs to be increased. Additionally, a second comparator can compare the output voltage of the period detector to the lower limit of the predetermined voltage range to determine if the frequency of the periodic signal at the VCO output node needs to be decreased.

The control loop can also comprise a variable resistance e-fuse adapted to apply the second voltage to the varactor(s) and a controller adapted to program the resistance in the variable resistance e-fuse, when the frequency is outside a predetermined frequency range, so as to selectively adjust the second voltage, so as to adjust the capacitance of the varactor(s), and further so as to bring the frequency of the periodic signal to within the predetermined frequency range. That is, the variable (i.e., programmable) resistance e-fuse can be electrically connected to the controller and to the varactor(s). The controller can be in communication with the plurality of comparators and can be adapted to program the resistance in the variable resistance e-fuse, when the frequency of the periodic signal at the VCO output node is outside the predetermined frequency range (i.e., when the output voltage from the period detector is outside the predetermined voltage range).

Programming of the e-fuse resistance is performed so as to selectively adjust the compensation voltage that will be applied to the varactor(s) during subsequent VCO operation, so as to selectively adjust the capacitance of the varactor(s), and further so as to bring the frequency of the periodic signal at the VCO output node to within the predetermined frequency range. For example, the controller can be adapted to selectively increase the resistance in the variable resistance e-fuse so as to selectively increase the compensation voltage at the varactor(s) in order to decrease the capacitance of the varactor(s) and, thereby increase the frequency of the periodic signal at the VCO output node, when the output voltage from the period detector is higher than the predetermined voltage range. The controller can further be adapted to selectively decrease the resistance of the variable resistance e-fuse so as to selectively decrease the compensation voltage at the varactor(s) in order to increase the capacitance of the varactor(s) and, thereby decrease the frequency of the periodic signal at the VCO output node, when the output voltage is lower than the predetermined voltage range.

An exemplary variable resistance e-fuse that can be incorporated into the present invention can comprise a non-volatile, re-programmable, bi-directional e-fuse. Specifically, this e-fuse can comprise a conductor, a plurality of series connected resistors and a plurality of copper contacts on the conductor connected to the plurality of the series connected resistors. The resistors can all be equal in size.

Additionally, first and second sensing nodes can be located on opposite ends of the series connected resistors. The first sensing node can be electrically connected to the varactor(s) and to a first current source via a switch. The second sensing node can be electrically connected via a switch to ground. During a sensing mode, the controller can be adapted to turn on these switches allowing the sensing current to flow from the first current source through the conductor of the variable resistance e-fuse between the first sensing node and the second sensing node in order to generate the second voltage (i.e., the compensation voltage) at the varactor(s). As mentioned above, the frequency of the periodic signal at the VCO output node is a function of the first voltage (i.e., the predetermined tuning voltage in the sensing mode) applied to the LC-tank and also a function of the second voltage (i.e., the compensation voltage) applied on the varactor(s).

First and second programming nodes can also be located on opposite ends of the conductor. The first and second programming nodes can each be connected by complementary switches to a second current source which is different from the first current source and to ground. During a programming mode, the controller can be adapted to use the switches to control a second current flow from this second current source to program the resistance in the variable resistance e-fuse. Specifically, the controller can be adapted to use the switches to control the flow of the second current through the conductor between the first programming node and the second programming node such that the second current flows in one direction from the first programming node (i.e., an anode programming node) to the second programming node (i.e., a cathode programming node), causing the contacts near the second programming node to become opens in sequence to increase the resistance; or such that the second current flows in the opposite direction from the second programming node (i.e., the anode programming) to the first programming node (i.e., the cathode programming node), causing the opened contacts near the second programming node to revert back to shorts in sequence to decrease the resistance. Note that the open contact sequence direction is in the direction of the electron flow from the cathode node to the anode node, which is opposite to the direction of the current flow from the anode node to the cathode node. Thus, the programming is bi-directional. Furthermore, due to the variable resistance e-fuse structure, the resulting resistance following programming is non-volatile (i.e., it is maintained even after the circuit is powered down), but reprogrammable on demand.

The embodiments of the voltage controlled oscillator are described above as incorporating only a single variable resistance e-fuse. Alternatively, the voltage controlled oscillator can comprise a plurality of such variable resistance e-fuses. Specifically, multiple variable resistance e-fuses can be connected in series. In this case, all of the resistors in any given variable resistance e-fuse will be equal in size. However, the resistors on adjacent variable resistance e-fuses will be progressively smaller in size. Such a structure allows for fine tuning of the frequency the periodic signal at the output node because each subsequent e-fuse can be programmed in order to make smaller incremental changes in overall resistance and, thereby to make smaller incremental changes to the compensation voltage applied to the varactor(s).

Also disclosed herein are embodiments of an associated method for operating a voltage controlled oscillator (VCO). The method embodiments comprise providing a VCO, such as the VCO described in detail above. That is, the provided VCO can comprise an inductor-capacitor (LC) tank circuit adapted to receive a first voltage (i.e., a supplied or tuning input voltage) and at least one varactor connected in parallel with the inductor-capacitor (LC) tank circuit and adapted to receive a second voltage (i.e., a compensation voltage) such that the VCO output can be a function of the first voltage and, if necessary, a second voltage.

Next, the VCO is powered up for the first time and a control loop is established within the VCO. In this control loop, the VCO is operated in successive sensing and programming modes. The sensing mode comprises determining whether the frequency of the periodic signal at the VCO output node in response to a set first voltage (i.e., a predetermined tuning input voltage) is within a predetermined frequency range. If, during the sensing mode, a determination is made that the frequency is outside the predetermined range, then the VCO enters the programming mode. The programming mode comprises, programming (i.e., selectively increasing or decreasing) the resistance in a variable resistance e-fuse, as necessary, to set the second voltage (i.e., the compensation voltage) to be applied to the varactor(s) and, thereby to bring the frequency of the periodic signal at the VCO output node into the predetermined frequency range.

During the sensing mode, the process of determining whether or not the frequency of the periodic signal at the VCO output node in response to a set first voltage (i.e., a predetermined tuning input voltage) is within the predetermined frequency range can be accomplished by determining a period of this periodic signal. The detected period can be converted into an output voltage. Through prior simulation and testing, it can be determined that an output voltage that is above an upper limit of a predetermined voltage range indicates that the period is too long. This in turn will indicate that the frequency of the periodic signal at the output node is too low. Similarly, an output voltage that is below a lower limit of the predetermined voltage range indicates that the period is too short. This in turn indicates that the frequency of the periodic signal at the output node is too high. Thus, once the output voltage is determined, it can be determined if the output voltage is within a predetermined voltage range and the frequency of the periodic signal at the VCO output node can be adjusted accordingly, during the programming mode.

For example, the output voltage can be compared to the upper limit of the predetermined voltage range to determine if the frequency of the periodic signal needs to be increased. Then, the resistance in the variable resistance e-fuse can be selectively increased so as to selectively increase the compensation voltage applied to the varactor(s) in order to selectively decrease the capacitance of the varactor(s) and, thereby to increase the frequency of the periodic signal at the VCO output node, when the output voltage is higher than the predetermined voltage range. Additionally, the output voltage can be compared to the lower limit of the predetermined voltage range to determine if the frequency of the periodic signal needs to be decreased. Then, the resistance in the variable resistance e-fuse can be selectively decreased so as to selectively decrease the compensation voltage at the varactor(s) in order to selectively increase the capacitance of the varactor(s), and thereby to decrease the frequency of the periodic signal at the VCO output node, when the output voltage is lower than the predetermined voltage range.

In the sensing mode, a first current from a first current source is forced to flow through the variable resistance e-fuse to the ground in order to generate the compensation voltage at the varactor(s). This same current can be forced to flow through the variable resistance e-fuse in order to generate the set compensation voltage, during subsequent standard operation (e.g., when a periodic signal is generated at the VCO output node in response to a supplied input voltage from an outside device, such as a filter in a phase locked loop (PLL) circuit). Contrarily, in the programming mode, a second current from a second current source different from the first current source is forced to flow through the variable resistance e-fuse in one direction or another to program the resistance therein without applying a second voltage (i.e., a compensation voltage) to the varactor(s).

The embodiments of the method are described above as including a programming step for only one variable resistance e-fuse. Alternatively, the voltage controlled oscillator can comprise a plurality of such variable resistance e-fuses. Specifically, multiple variable resistance e-fuses can be connected in series. In this case, all of the resistors in any given variable resistance e-fuse will be equal in size. However, the resistors on adjacent variable resistance e-fuses will be progressively smaller in size. Such a structure allows for fine tuning of the frequency the periodic signal at the output node because each subsequent e-fuse can be programmed in order to make smaller incremental changes in overall resistance and, thereby to make smaller incremental changes to the compensation voltage applied to the varactor(s).

Also disclosed are embodiments of a design structure for the above described voltage controlled oscillator. This design structure can be embodied in a machine readable medium, can reside on storage medium as a data format used for the exchange of layout data of integrated circuits and can comprise, for example, a netlist.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF THE INVENTION

Figure 1:
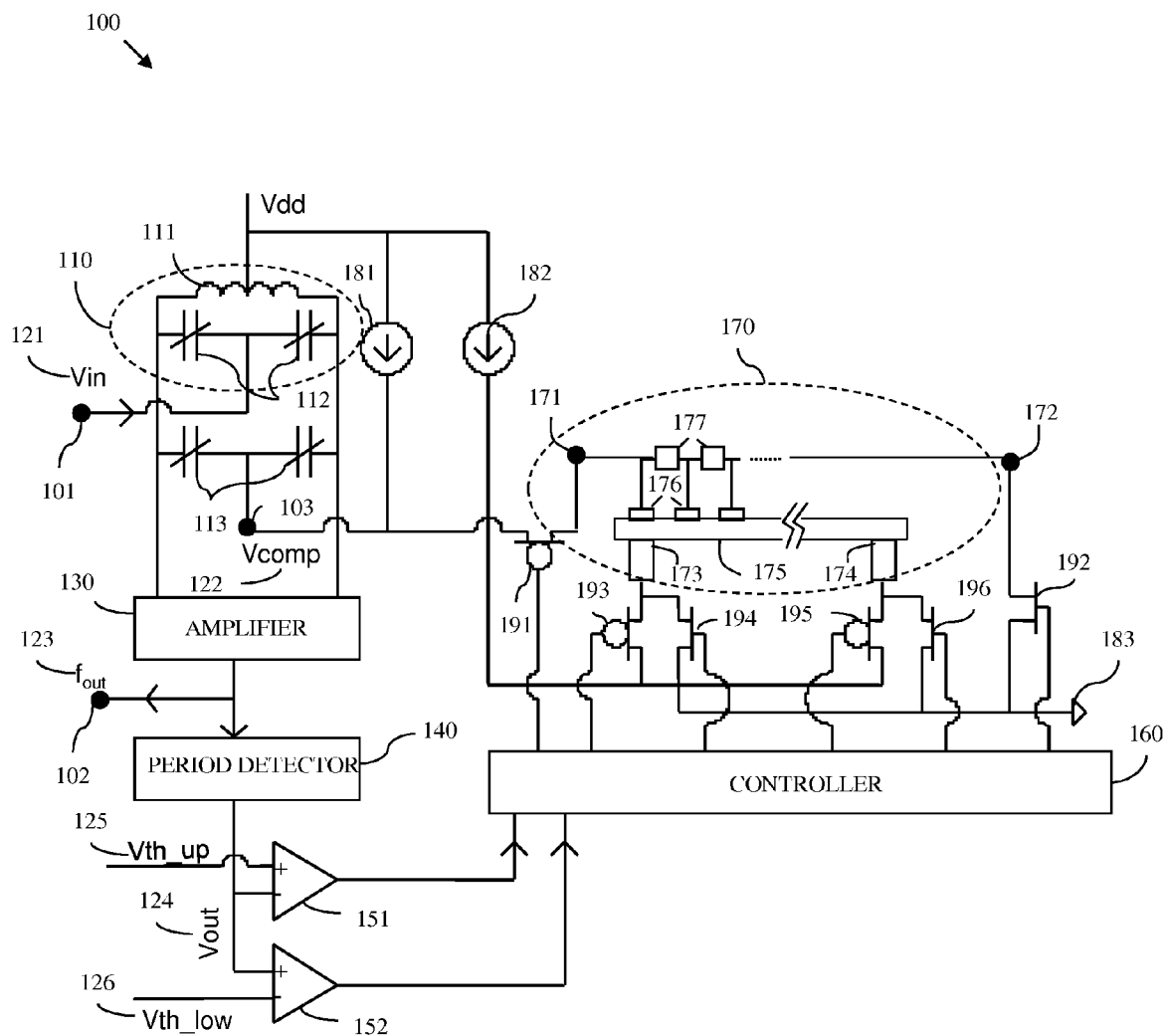
FIG. 1 is a schematic diagram illustrating an embodiment of a voltage controlled oscillator (VCO)

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, process variations impact performance in all technologies. In voltage controlled oscillators (VCOs) such process variations can have a significant impact on operation frequency. Specifically, with continued device scaling, process variations can impact the operational frequency range of a VCO such that it is no longer within specification. One conventional solution is to increase the VCO frequency coverage by using a small inductance in the inductor-capacitor (LC) tank within the VCO. One disadvantage of such a solution is the fact that small inductance in the LC tank reduces the Q value of the LC tank such that phase noise is increased. Another disadvantage is the fact that the VCO will operate in a different part of the VCO frequency coverage and the VCO gain will be different. Consequently, it is difficult to achieve the specifications required for a given circuit (e.g., a phase locked loop) that is to incorporate the VCO. Since once a product is manufactured the impact of such process variations on operation frequency is fixed, it would be advantageous to provide a voltage controlled oscillator capable of non-volatile self-correction to compensate for process variations and to ensure that the center frequency is maintained within the predetermined frequency range.

In view of the foregoing disclosed herein are embodiments of a voltage controlled oscillator (VCO) capable of non-volatile self-correction to compensate for process variations and, thereby to ensure that the center frequency of the VCO is maintained within a predetermined frequency range. Embodiments of this VCO incorporate a pair of varactors connected in parallel to an inductor-capacitor (LC) tank circuit for outputting a periodic signal having a frequency that varies as a function of an input voltage (e.g., increases with an increasing input voltage, decreases with a decreasing input voltage). The embodiments further incorporate a control loop. This control loop uses programmable variable resistance e-fuse(s) to set a compensation voltage to be applied to the pair of varactors. By adjusting the compensation voltage, the capacitance of the pair of varactors can be adjusted in order to selectively increase or decrease the frequency of the periodic signal in response to an input voltage and, thereby bring the frequency of that periodic signal into the predetermined frequency range.

Referring to FIG. 1, disclosed herein are embodiments of a voltage controlled oscillator (VCO) 100. The VCO embodiments 100 can comprise an inductor-capacitor (LC) tank 110 adapted to receive a first voltage 121 (i.e., a supplied input voltage in an operating mode or a predetermined tuning input voltage in a sensing mode) for controlling capacitance in the LC tank 110 and at least one varactor 113 connected in parallel with the LC tank 110 and adapted to receive a second voltage 122 (i.e., a compensation voltage) for controlling capacitance in the varactor(s) 113. The VCO embodiments 100 can further comprise a VCO output node 102 that is connected to the LC tank 110 and the varactor(s) 113 and that is adapted to output a periodic signal that is generated by the parallel connected LC tank 110 and varactor(s) 113. Thus, the frequency 123 of the periodic signal at the VCO output node 102 will be a function (e.g., an increase function) of the first voltage 121 (i.e., the supplied or tuning input voltage) and, if necessary, can also be a function of the second voltage 122 (i.e., the compensation voltage).

Additionally, the VCO embodiments 100 can comprise a control loop between the VCO output node 102 and the varactor(s) 113 connected in parallel with the LC tank 110. This control loop can be adapted to determine if the frequency 123 of the periodic signal at the VCO output node 102 in response to a set first voltage 121 (i.e., a predetermined tuning input voltage) is outside a predetermined frequency range and, if necessary, can be adapted to bring that frequency back into the predetermined frequency range by determining the required second voltage 122 (i.e., the required compensation voltage) and applying that second voltage 122 to the varactor(s) 113 during subsequent sensing and/or operational modes.

More specifically, the VCO 100 embodiments comprise an input node 101, an output node 102, and an inductor-capacitor (LC) tank circuit 110. The LC tank circuit 110 can, for example, comprise an inductor 111 connected in parallel to at least one variable capacitor or varactor 112. For example, the inductor 111 can be connected in parallel to a first pair of series connected varactors. A first voltage 121 received at the input node 101 can control the capacitance of varactor(s) 112 in the LC tank 110.

As discussed in greater detail below, the source of the input voltage 121 will change depending upon whether the VCO 100 is in sensing and programming modes or in a standard operational mode. That is, in the sensing and programming modes, the first voltage 121 at the input node 101 can be a predetermined tuning input voltage. Contrarily, in a standard operational mode, the first voltage 121 at the input node 101 can be a supplied input voltage from an external device (e.g., a filter of a phase locked loop (PLL) circuit).

The VCO 100 embodiments can further comprise at least one varactor 113 that is connected in parallel with the LC tank circuit 110. For example, a second pair of series connected varactors 113 can be connected in parallel to the LC tank circuit 110. A second voltage (i.e., a compensation voltage) applied to the varactor(s) 113 (e.g., at node 103) can control the capacitance of the varactor(s) 113.

The parallel connected LC tank circuit 110 and varactor(s) 113 are configured such that the frequency 123 of the periodic signal at the output node 102 is a function of both the first voltage 121 and the second voltage 122. For example, increasing or decreasing either of the voltages 121 or 122 will result in a corresponding increase or decrease, respectively, in the frequency 123 of the periodic signal at the output node 102. An amplifier 130 connected between the VCO output node 102 and the LC tank with the varactor(s) 113 can magnify this periodic signal.

The VCO 100 embodiments can also comprise a control loop for determining if the frequency 123 of the periodic signal at the output node 102 in response to a set input voltage 121 (i.e., in response to a predetermined tuning input voltage) is outside a predetermined frequency range and, if necessary, for bringing that frequency 123 back into the predetermined frequency range by determining the required second voltage 122 (i.e., the required compensation voltage) and applying that second voltage 122 to the varactor(s) 113. Specifically, the control loop can comprise a period detector 140 connected to the VCO output node 102. This period detector 140 can be adapted to determine the period of the periodic signal at the output node 102 and to convert that period into an output voltage 124. Through simulation and testing, it can be determined that an output voltage 124 that is above an upper limit of a predetermined voltage range indicates that the period is too long. This in turn will indicate that the frequency of the periodic signal at the output node is too low. Similarly, an output voltage 124 that is below a lower limit of the predetermined voltage range indicates that the period is too short. This in turn indicates that the frequency 123 of the periodic signal at the output node 102 is too high.

Thus, the control loop can further comprise a plurality of voltage comparators 151-152 adapted to determine if the output voltage 124 of the period detector 140 is within a predetermined voltage range. For example, a first comparator 151 can compare the output voltage 124 of the period detector 140 to the upper limit (i.e., Vth_up 125) of the predetermined voltage range to determine if the frequency 123 of the periodic signal at the VCO output node 102 needs to be increased. Additionally, a second comparator 152 can compare the output voltage 124 of the period detector 140 to the lower limit (i.e., Vth_low 126) of the predetermined voltage range to determine if the frequency 123 of the periodic signal at the VCO output node 102 needs to be decreased.

The control loop can also comprise a variable (i.e., programmable) resistance e-fuse 170 electrically connected to the varactor(s) 113 (e.g., at node 103) for applying a compensation voltage 122 (i.e., a second voltage) to those varactor(s) 113, as necessary, in order to adjust the frequency 123 of the periodic signal at the VCO output node 102. The variable resistance e-fuse 170 can also be electrically connected to a controller 160 for programming the variable resistance e-fuse 170 to ensure that the proper compensation voltage 122 is applied.

More specifically, increasing or decreasing the frequency 123 of the periodic signal at the VCO output node 102 can be accomplished by decreasing or increasing, respectively, the capacitance of the varactor(s) 113. Increasing or decreasing the capacitance of the varactor(s) 113 can in turn be accomplished by decreasing or increasing, respectively, the compensation voltage 122 applied to the varactors(s) 113. Finally, increasing or decreasing the compensation voltage 122 applied to the varactor(s) 113 can in turn be accomplished by increasing or decreasing, respectively, the resistance of the variable resistance e-fuse 170. Once the compensation voltage 122 is set, it will be applied to the varactor(s) 113 during subsequent sensing operations and also during normal VCO 100 operations to compensate for process variations.

To accomplish this, the controller 160 is in communication with the plurality of comparators 151-152. The controller 160 is adapted to program the resistance in the variable resistance e-fuse 170, when the frequency 123 of the periodic signal at the VCO output node 102 in response to a set input voltage 121 is outside the predetermined frequency range (i.e., when the output voltage 124 from the period detector 140 is outside the predetermined voltage range or more specifically, either above the upper limit 125 or below the lower limit 126). Programming the resistance is performed so as to selectively adjust the compensation voltage 122 at the varactor(s) 113, so as to selectively adjust the capacitance of the varactor(s) 113, and further so as bring the frequency 122 of the periodic signal at the VCO output node 102 to within the predetermined frequency range.

For example, the controller 160 can be adapted to selectively increase the resistance in the variable resistance e-fuse 170 so as to selectively increase the compensation voltage 122 at the varactor(s) 113 in order to decrease the capacitance of the varactor(s) 113 and, thereby increase the frequency 122 of the periodic signal at the VCO output node 102, when the output voltage 124 from the period detector 140 is higher than the upper limit of the predetermined voltage range. The controller 160 can further be adapted to selectively decrease the resistance of the variable resistance e-fuse 170 so as to selectively decrease the compensation voltage 122 at the varactor(s) 113 in order to increase the capacitance of the varactor(s) 113 and, thereby decrease the frequency 122 of the periodic signal at the VCO output node 102, when the output voltage 124 is lower than the low limit of the predetermined voltage range.

An exemplary variable resistance e-fuse 170 that can be incorporated into the present invention can comprise a non-volatile, re-programmable, bi-directional e-fuse. Specifically, this e-fuse 170 can comprise a conductor 175, a plurality of series connected resistors 177 (i.e., a resistor bank) and a plurality of metal contacts 176 (e.g., copper (Cu) or tungsten (W) contacts) on the conductor 175 and connected to the plurality of the series connected resistors 177, as illustrated. The resistors 177 can all be equal in size.

First and second sensing nodes 171, 172 can be located on opposite ends of the resistor bank (i.e., on opposite ends of the series connected resistors 177). The first sensing node 171 can be electrically connected to the varactor(s) 113 and to a first current source 181 via a switch 191 (e.g., a p-type field effect transistor (PFET)). The second sensing node 172 can be electrically connected via a switch 192 (e.g., an n-type field effect transistor (NFET)) to ground 183. During a sensing mode (and also during an operational mode), the controller 160 can be adapted to turn on these switches 191-192 allowing the first current to flow from the sensing current source 181 through the metal conductor wire 175 (e.g., copper wire) of the variable resistance e-fuse 170 between the first sensing node 171 and the second sensing node 172 to ground 183 in order to generate the compensation voltage 122 at the varactor(s) 113. During the sensing mode, a set input voltage (i.e., a predetermined tuning input voltage) is applied to the VCO input node 101. During the operational mode, the frequency of the periodic signal at the VCO output node is an increase function of a first voltage 121 that comprises a supplied input voltage from another device (e.g., from the filter of a phase locked loop circuit). It should be noted that during the sensing and standard operational modes, switches 193-196, discussed in greater detail below with regard to programming, are turned off so that the second current from the second current source 182 does not pass through the e-fuse 170.

First and second programming nodes 173, 174 can also be located on opposite ends of the conductor 175. The first and second programming nodes 173, 174 can each be connected by complementary switches 193-194, 195-196 (e.g., NFETs and PFETs) to a second current source 182 which is different from the first current source 181 and to ground 183. During the programming mode, the controller 160 can be adapted to use the switches 193-196 to control second current flow from this second current source 182 to program resistance in the variable resistance e-fuse 170.

Figure 2A:
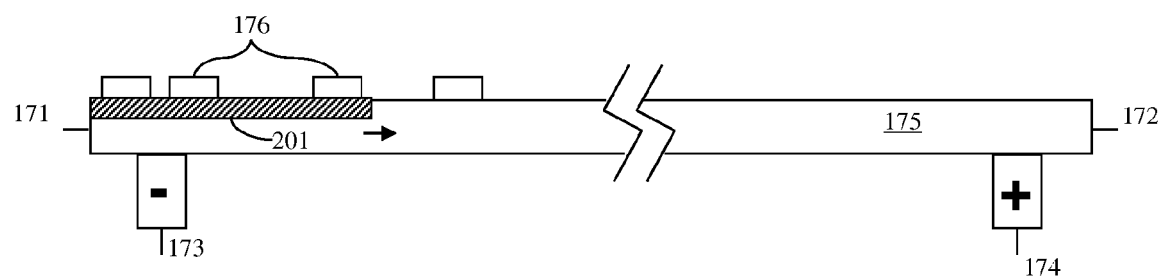
FIG. 2a is a diagram illustrating an exemplary programming process wherein resistance is increased in a variable resistance e-fuse.
Figure 2B:
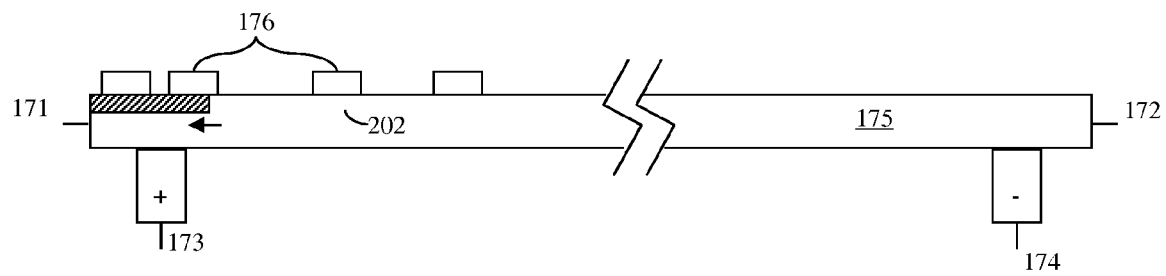
FIG. 2b is a diagram illustrating an exemplary programming process wherein resistance is decreased in a variable resistance e-fuse.

Programming in the e-fuse 170 is bi-directional, taking advantage of electro-migration in the metal (such as copper) conductor wire 175 in response to applied currents (e.g., as described in U.S. patent application Ser. No. 11/839,716, filed Aug. 16, 2007, the entire disclosure of which is incorporated herein by reference). Specifically, the controller 160 can be adapted to use the switches 193,196 to control the flow of the second current through the conductor 175 between the first programming node 173 (i.e., the anode programming node) and the second programming node 174 (i.e., the cathode programming node) such that the second current flows in one direction causing the contacts 176 near the cathode end of the conductor wire 175 to become opens 201 in sequence to increase the resistance (e.g., as illustrated in FIG. 2a) or such that the second current flows in the opposite direction causing the previously opened contacts 176 to revert back to shorts 202 in sequence to decrease the resistance (e.g., as illustrated in FIG. 2b). It should be noted that during this programming mode, switches 191-192, discussed above, are turned off so that current from current source 181 does not generate voltage at the varactor(s) 113 and, thereby impact the capacitance in the varactor(s) 113.

The sensing and programming processes, described above, are repeated by the controller 170 until the frequency 123 of the periodic signal at the output node 102 is found to be within the predetermined frequency range. Once programming is complete, the resulting resistance in the e-fuse 170 is non-volatile (i.e., it is maintained even after the circuit is powered down). Thus, the VCO 100 can be repeatedly powered up without having to reprogram the resistance in the e-fuse 170 to achieve the desired voltage compensation. However, the resistance is not fixed permanently. Thus, if it is necessary to alter the center frequency of the VCO 100 for any reason, the e-fuse 170 can be reprogrammed on demand.

Figure 3:
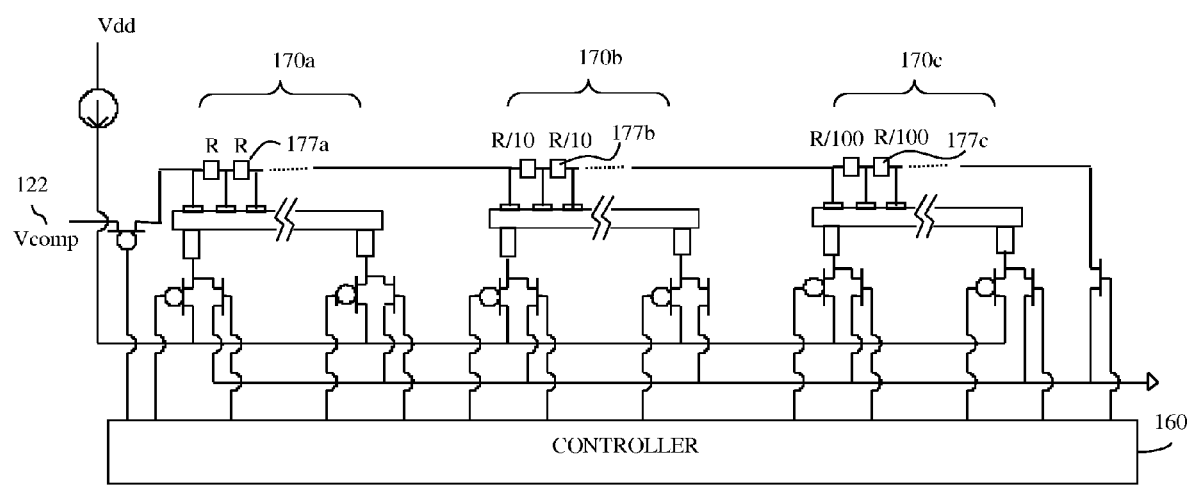
FIG. 3 is a schematic diagram illustrating an alternative configuration for the VCO of FIG. 1 incorporating multiple series connected e-fuses.

The embodiments of the VCO 100 are described above and illustrated in FIG. 1 as incorporating only a single variable resistance e-fuse 170. Alternatively, as illustrated in FIG. 3, the VCO 100 can comprise a plurality of such variable resistance e-fuses 170a-c. Specifically, multiple variable resistance e-fuses 170a-c can be connected in series. In this case, all of the resistors in any given variable resistance e-fuse 170a-c will be equal in size. However, the resistors (e.g., 177a, 177b, 177c) on adjacent variable resistance e-fuses 170a-c will be progressively smaller in size (e.g., R for 177a, R/10 for 177b, R/100 for 177c, etc.). Such a structure allows for fine tuning of the frequency 123 of the periodic signal at the output node 102 because each subsequent e-fuse (e.g., 170a then 170b then 170c) can be programmed in sequence in order to make smaller incremental changes in overall resistance and, thereby to make smaller incremental changes to the compensation voltage 122 applied to the varactor(s) 113. Thus, compensation resolution can be improved.

Figure 4:
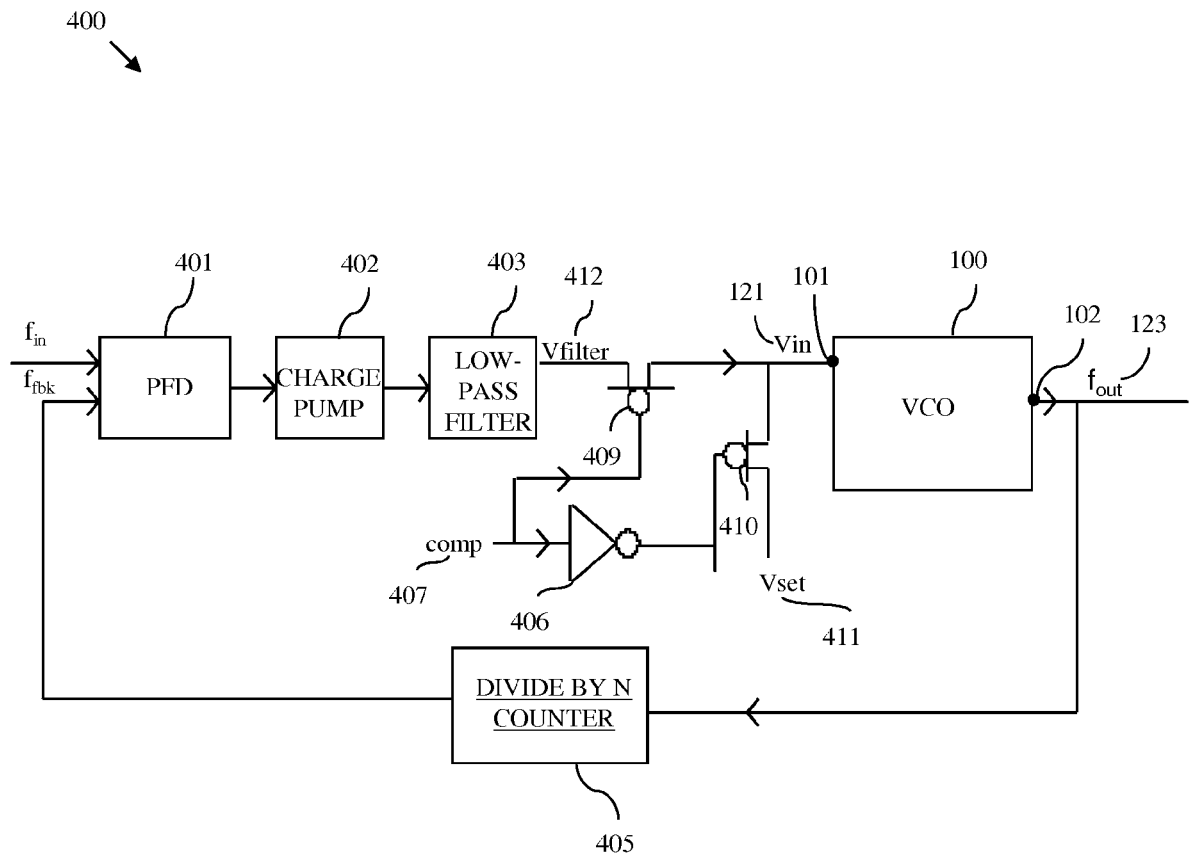
FIG. 4 is a diagram illustrating an exemplary phase locked loop (PLL) circuit that can incorporate the VCO of FIG. 1.

FIG. 4 represents an exemplary phase locked loop (PLL) circuit 400 that can incorporate the VCO 100 of the present invention. Specifically, the PLL circuit 400 can comprise a phase/frequency detector (PFD) 401, a charge pump 402, a low-pass filter 403, the VCO 100, and a divide-by-N counter 405. The PLL 400 is a negative feed back circuit. That is, during normal PLL operation, the phase/frequency detector 401 is adapted to detect the phase/frequency difference between a reference frequency $f_{in}$ and the feedback frequency $f_{fbk}$ (e.g., the output frequency $f_{out}$ 123 of the VCO 100 after passing through a divide-by-N counter 405) and to signal to the charge pump 402 to increase or decrease the frequency of the VCO 100, as necessary. For example, if $f_{in}$ is operating at a slightly faster frequency than $f_{fbk}$, the PFD 401 can output an UP signal to the charge pump 402. Contrarily, if $f_{in}$ is operating at a slightly slower frequency than $f_{fbk}$, the PFD 401 can output a DOWN signal to the charge pump 402. The loop filter 403 makes sure that the voltage 412 (Vfilter) applied to the VCO 100 changes gradually and prevents spiking attributes or system instable.

During normal PLL operations, the signal 407 will be set (e.g., by the controller 170) at logic low so that the switch 409 (e.g., a PFET) is turned on and the switch 410 (e.g., also a PFET) is turned off. Thus, during normal PLL operations, the first voltage 121 to the VCO 100 at the node 101 will comprise a supplied input voltage 412 from the filter 403. However, during sensing and programming operations (e.g., when the PLL 400 is powered on for the first time or when the VCO 100 otherwise requires reprogramming), the signal 407 will be set (e.g., by controller 170) at logic high so that the switch 409 is turned off and the switch 410 is turned on. Thus, during sensing and programming operations, the first voltage 121 to the VCO 100 at the node 101 will be a predetermined tuning input voltage supplied (not by the filter 403) but by a supply voltage 411 (Vset) having a fixed, pre-defined value. This fixed voltage value should optimally be set at the center of the VCO 100 input tuning range.

Figure 5:
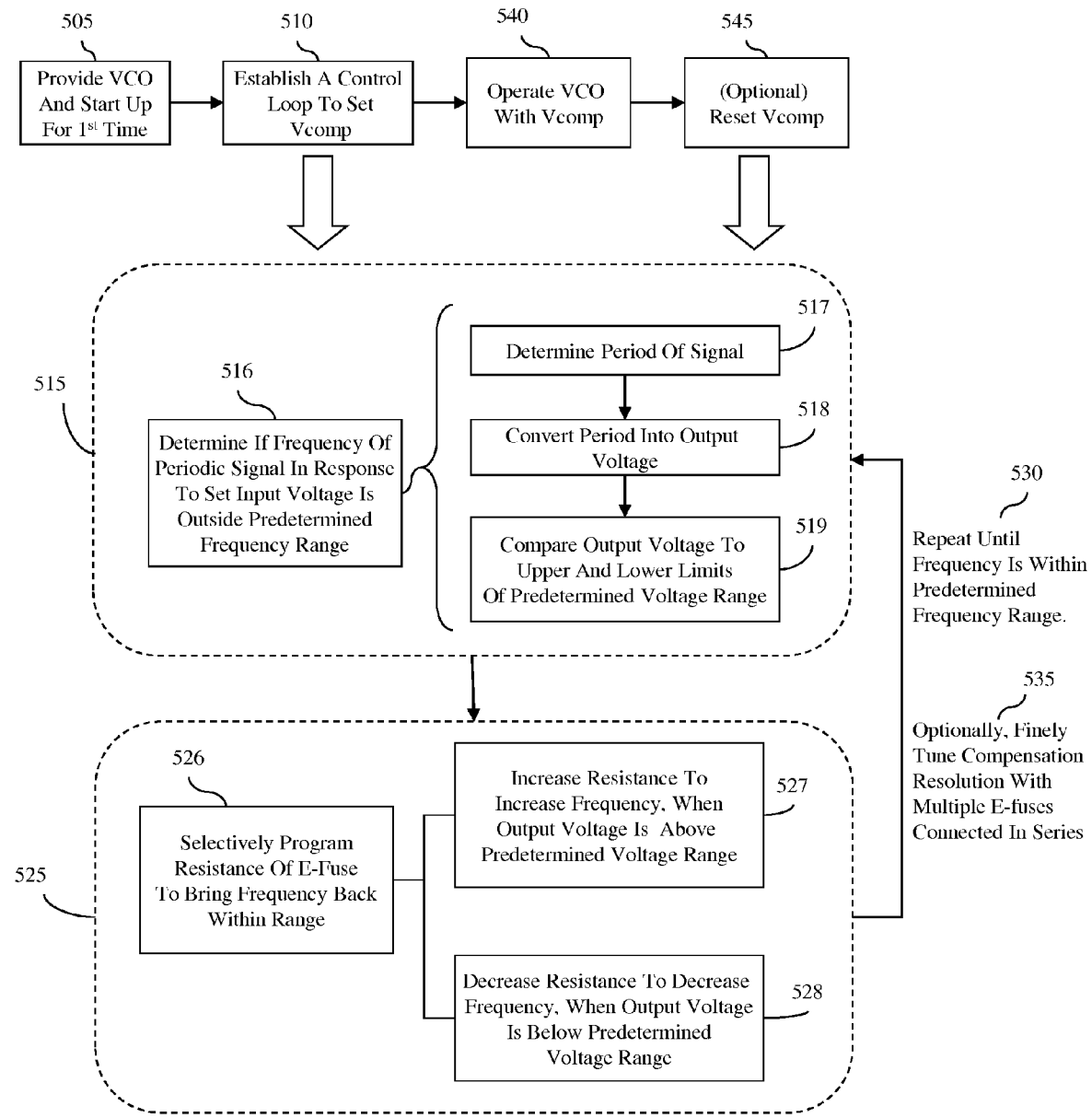
FIG. 5 is a flow diagram illustrating an embodiment of a method for operating a VCO.

Referring to FIG. 5, also disclosed herein are embodiments of an associated method for operating a voltage controlled oscillator (VCO). The method embodiments comprise providing a VCO, such as the VCO 100 described in detail above and illustrated in FIG. 1, for outputting a periodic signal that has a frequency 123 as a function (e.g., an increase function) of a first voltage 121 (i.e., either a supplied input voltage during an operational mode or a tuning input voltage during a sensing mode) and, as necessary, a second voltage (i.e., a compensation voltage) (505). Specifically, the provided VCO 100 can comprise an inductor-capacitor (LC) tank circuit 110 adapted to receive a first voltage 121 for controlling capacitance in the LC tank circuit 110 and at least one varactor 113 connected in parallel with the inductor-capacitor (LC) tank circuit 110 and adapted to receive a second voltage 122 for controlling capacitance in the varactor(s) 113. The parallel connected LC tank circuit 110 and varactor(s) 113 can be configured such that the frequency 123 of the periodic signal at an output node 102 is a function of both the first voltage 121 and the second voltage 122. For example, increasing or decreasing either of the voltages 121 or 122 will result in a corresponding increase or decrease, respectively, in the frequency 123 of the periodic signal at the output node 102.

Next, the provided VCO is powered up for the first time and a control loop is established within the VCO 100 (510). In order to establish the control loop at process 510, the VCO 100 is operated in two different sequential modes: a sensing mode 515 and a programming mode 525. The different modes 515 and 525 can, for example, be controlled automatically by a controller 160. In the sensing mode 515, a determination is made as to whether the frequency 123 of the periodic signal at the VCO output node 102 in response to a set first voltage 121 (i.e., a predetermined tuning input voltage) is within a predetermined frequency range (516). Then, in the programming mode 525, if the frequency is outside the predetermined frequency range, the resistance in a variable resistance e-fuse 170 that is electrically connected to the varactor(s) 113 is selectively programmed to bring the frequency 123 back into the predetermined frequency range by determining a required second voltage (i.e., a required compensation voltage and applying that compensation voltage to the varactor(s) 113 (526). These different modes may further be repeated, as necessary, until the frequency 123 is within the predetermined frequency range (530).

Specifically, in the sensing mode 515, the process 516 of determining whether or not the frequency 123 of the periodic signal at the VCO output node 102 in response to a set input voltage 121 (i.e., a tuning input voltage) is within the predetermined frequency range can be accomplished by determining a period of this periodic signal (517). This process 517 can be accomplished, for example, using a period detector 140 connected to the amplifier 130. The detected period can be converted into an output voltage 124 (e.g., also by the period detector) (518). Through prior simulation and testing, it can be determined that an output voltage 124 that is above an upper limit of a predetermined voltage range indicates that the period is too long. This in turn will indicate that the frequency 123 of the periodic signal at the output node 102 is too low. Similarly, an output voltage 124 that is below a lower limit of the predetermined voltage range indicates that the period is too short. This in turn indicates that the frequency 123 of the periodic signal at the output node 102 is too high. Thus, once the output voltage 124 is determined, a determination can also be made as to whether or not the output voltage 124 is within a predetermined voltage range (519). This process 519 can be accomplished, for example using a plurality of voltage comparators 151-152 to compare the output voltage 124 to the upper and lower limits of the predetermined voltage range.

Next, during the programming mode 525, the frequency 123 of the periodic signal at the VCO output node 102 is adjusted, based on the determinations made at process 519 (526). Specifically, increasing or decreasing the frequency 123 of the periodic signal at the VCO output node 102 can be accomplished by decreasing or increasing, respectively, the capacitance of the varactor(s) 113. Increasing or decreasing the capacitance of the varactor(s) 113 can in turn be accomplished by decreasing or increasing, respectively, a compensation voltage 122 (i.e., a second voltage) applied to the varactors(s) 113. Finally, increasing or decreasing the compensation voltage 122 applied to the varactor(s) 113 can in turn be accomplished by increasing or decreasing, respectively, the resistance of the variable resistance e-fuse 170. Thus, during programming 525, the resistance in the variable resistance e-fuse is selectively programmed so as to selectively adjust the compensation voltage 122 at the varactor(s) 113, so as to selectively adjust capacitance of the varactor(s) 113, and further so as to bring the frequency 123 of the periodic signal at the VCO output node 102 to within the predetermined frequency range.

For example, at process 519 the output voltage 124 of the period detector 140 can be compared (e.g., using a first voltage comparator 151) to the upper limit 125 of the predetermined voltage range to determine if the frequency 123 of the periodic signal needs to be increased. Then, the resistance in the variable resistance e-fuse 170 can be selectively increased at process 526 so as to selectively increase the compensation voltage 122 applied to the varactor(s) 113 in order to selectively decrease the capacitance of the varactor(s) 113 and, thereby to increase the frequency 123 of the periodic signal at the VCO output node 102, when the output voltage is higher than the predetermined voltage range (527). Additionally, at process 519 the output voltage 124 can be compared (e.g., using a second voltage comparator 152) to the lower limit 126 of the predetermined voltage range to determine if the frequency 123 of the periodic signal needs to be decreased. Then, the resistance in the variable resistance e-fuse 170 can be selectively decreased at process 526 so as to selectively decrease the compensation voltage 122 at the varactor(s) 133 in order to selectively increase the capacitance of the varactor(s), and thereby to decrease the frequency 123 of the periodic signal at the VCO output node 102, when the output voltage is lower than the predetermined voltage range (528).

As mentioned above, the sensing and programming modes 515 and 525 can be repeated until it is determined that the output voltage 124 is within the predetermined voltage range and, thus, that the frequency 123 of the periodic signal is within the predetermined frequency range (530).

The embodiments of the method, as described above, reference only a single variable resistance e-fuse. Alternatively, the provided VCO 100 can comprise a plurality of such variable resistance e-fuses 170a-c (e.g., as illustrated in FIG. 3). Specifically, multiple variable resistance e-fuses 170a-c can be connected in series. In this case, all of the resistors in any given variable resistance e-fuse 170a-c will be equal in size. However, the resistors (e.g., 177a, 177b, 177c) on adjacent variable resistance e-fuses 170a-c will be progressively smaller in size (e.g., R for 177a, R/10 for 177b, R/100 for 177c, etc.). With such a structure, the method embodiments can comprise fine tuning the frequency 123 of the periodic signal at the output node 102. That is, each subsequent e-fuse (e.g., 170a then 170b then 170c) can be programmed in order to make smaller incremental changes in overall resistance and, thereby to make smaller incremental changes to the compensation voltage 122 applied to the varactor(s) 113 in order to improve compensation resolution.

In addition to the sensing and programming modes 515 and 525, described above, the VCO 100 of the present invention can also be operated in a standard operating mode, wherein a periodic signal is generated at the VCO output node 102 in response to a first voltage 121 supplied from an outside device (525). For example, the VCO 100 can be incorporated into a phase locked loop (PLL) circuit 400, as illustrated in FIG. 4, and the first voltage 121 to the VCO 100 can be provided by a filter 403 (e.g., see item Vfilter 412).

The different modes can be controlled automatically using a controller and a series of switches. Specifically, during the sensing mode 515, a first current from a first current source 181 is forced (e.g., by means of switches 191 and 192) to flow through the variable resistance e-fuse 170 to the ground 183 in order to generate the compensation voltage 122 at the varactor(s) 113. Thus, a determination can be made as to whether or not frequency adjustment is required. In the standard operational mode 540, the first current 181 from the first current source 181 is similarly forced (e.g., by means of switches 191 and 192) to flow through the variable resistance e-fuse to the ground 183 in order to generate the previously set compensation voltage 122 at the varactor(s) 113. Thus, when the VCO 100 is powered on and in the standard operating mode, the compensation voltage 122 will be continuously applied to the varactor(s) 113 so that the VCO 100 operates within the predetermined frequency range. Contrarily, in the programming mode 525, a second current from a second current source 182 different from the first current source 181 is forced (e.g., by means of switches 193-196) to flow through the variable resistance e-fuse 170 in one direction or another to program the resistance therein.

In addition to programming the resistance of the variable resistance e-fuse 170 at start-up, the method embodiment can also comprise optionally readjusting the center frequency of the VCO 100 by performing the sensing and programming modes 515 and 525 and resetting the compensation voltage 122 (545). This reprogramming process 545 can be performed at some point after the initial start-up, when alterative programming is required or desired.

Figure 6:
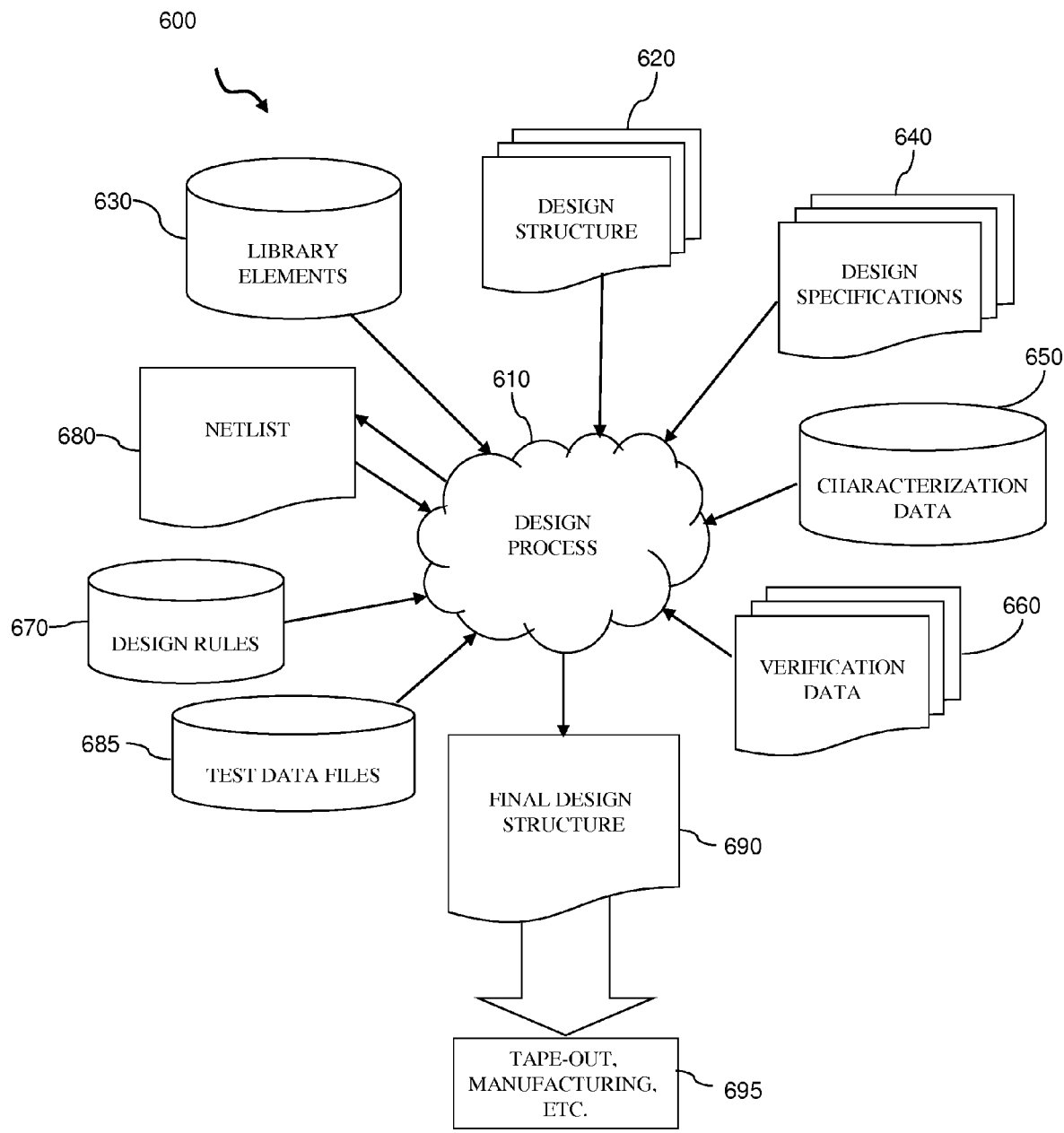
FIG. 6 is a flow diagram of a design process used in semiconductor design, manufacture, and/or test.

Also disclosed are embodiments of a design structure for the above described voltage controlled oscillator. Specifically, FIG. 6 shows a block diagram of an exemplary design flow 600 used for example, in semiconductor design, manufacturing, and/or test. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises an embodiment of the invention as shown in FIGS. 1-3 in the form of schematics or HDL, a hardware-description language (e.g., Verilog, VHDL, C, etc.). Design structure 620 may be contained on one or more machine readable medium. For example, design structure 620 may be a text file or a graphical representation of an embodiment of the invention as shown in FIGS. 1-3. Design process 610 preferably synthesizes (or translates) an embodiment of the invention as shown in FIGS. 1-3 into a netlist 680, where netlist 680 is, for example, a list of wires, transistors, logic gates, control circuits, I/O, models, etc. that describes the connections to other elements and circuits in an integrated circuit design and recorded on at least one of machine readable medium. This may be an iterative process in which netlist 680 is resynthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 685 (which may include test patterns and other testing information). Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates an embodiment of the invention as shown in FIGS. 1-3, along with any integrated circuit design or data (if applicable), into a second design structure 690. Design structure 690 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 690 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-3. Design structure 690 may then proceed to a stage 695 where, for example, design structure 690: proceeds to tape-out, is released to manufacturing, is released to a mask house, is sent to another design house, is sent back to the customer, etc.

Therefore, disclosed above are embodiments of a voltage controlled oscillator (VCO) capable of non-volatile self-correction to compensate for process variations and, thereby to ensure that the center frequency of the VCO is maintained within a predetermined frequency range. Embodiments of this VCO incorporate a pair of varactors connected in parallel to an inductor-capacitor (LC) tank circuit for outputting a periodic signal having a frequency that varies as a function of an input voltage (e.g., increases with an increasing input voltage, decreases with a decreasing input voltage). The embodiments further incorporate a control loop. This control loop uses programmable variable resistance e-fuse(s) to set a compensation voltage to be applied to the pair of varactors. By adjusting the compensation voltage, the capacitance of the pair of varactors can be adjusted in order to selectively increase or decrease the frequency of the periodic signal in response to an input voltage and, thereby bring the frequency of that periodic signal into the predetermined frequency range. Also disclosed are embodiments of an associated design structure for such a VCO and an associated method for operating such a VCO.

The above-described embodiments of the present invention provide multiple benefits over prior art VCO process variation compensation techniques. Specifically, they allow for VCO process variation compensation with minimal area costs, without reducing the Q value of VCO and with high resolution (e.g., when multiple e-fuses connected in series are programmed to establish the compensation voltage). The embodiments further allow for non-volatile compensation. That is, the programmed resistance in the e-fuse(s) and, thereby the established compensation voltage is maintain even when power to the VCO is off. Thus, compensation programming is only required at initial start-up, with reprogramming being optional.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A voltage controlled oscillator comprising:
   an inductor-capacitor (LC) tank adapted to receive a first voltage;
   at least one varactor connected in parallel with said LC tank and adapted to receive a second voltage;
   an output node connected to said LC tank and said at least one varactor for outputting a periodic signal having a frequency that is a function of said first voltage and said second voltage;
   a variable resistance e-fuse adapted to apply said second voltage to said at least one varactor; and
   a controller adapted to program resistance in said variable resistance e-fuse, when said frequency is outside a predetermined frequency range, so as to selectively adjust said second voltage, so as to adjust capacitance of said at least one varactor, and further so as to bring said frequency of said periodic signal to within said predetermined frequency range.

2. The voltage controlled oscillator according to claim 1, further comprising:
   a period detector adapted to determine a period of said periodic signal and to convert said period into an output voltage; and
   a plurality of voltage comparators adapted to determine if said output voltage is within a predetermined voltage range,
   wherein said controller is in communication with said plurality of comparators and is adapted to program said resistance to selectively adjust said second voltage, when said output voltage is outside said predetermined voltage range, so as to bring said frequency to within said predetermined frequency range.

3. The voltage controlled oscillator according to claim 2, wherein said controller is adapted to selectively increase said resistance so as to increase said second voltage in order to decrease said capacitance and, thereby increase said frequency, when said output voltage is higher than said predetermined voltage range, and
   wherein said controller is further adapted to selectively decrease said resistance so as to decrease said second voltage in order to increase said capacitance and, thereby decrease said frequency, when said output voltage is lower than said predetermined voltage range.

4. The voltage controlled oscillator according to claim 1, wherein said variable resistance e-fuse comprises:
   a conductor;
   a plurality of series connected resistors;
   a plurality of contacts on said conductor connected to said plurality of said series connected resistors;
   a first sensing node and a second sensing node on opposite ends of said the series connected resistors, wherein said first said sensing node is electrically connected to said at least one varactor for applying said second voltage to said at least one varactor and said second sensing node is electrically connected to ground; and
   a first programming node and a second programming node on opposite ends of said conductor, and
   wherein said controller is adapted to control current flow through said conductor between said first programming node and said second programming node such that said contacts one of become opens in sequence to increase said resistance and revert back to shorts in sequence to decrease said resistance.

5. The voltage controlled oscillator according to claim 4, wherein said resistors are all equal in size.

6. The voltage controlled oscillator according claim 4, further comprising a plurality of said variable resistance e-fuses connected in series, wherein all of said resistors in any given variable resistance e-fuse are equal in size and wherein said resistors on adjacent variable resistance e-fuses are progressively smaller in size so as to allow for fine tuning of said frequency.

7. The voltage controlled oscillator according to claim 1, further comprising a first current source for generating said second voltage and a second current source different from said first current source for programming said resistance.

8. The voltage controlled oscillator according to claim 1, further comprising an amplifier electrically connected between said varactor and said control loop so as to magnify said periodic signal.

9. The voltage controlled oscillator according to claim 1, wherein said resistance is non-volatile and reprogrammable.

10. A design structure for a voltage controlled oscillator, said design structure embodied in a machine readable medium and said voltage controlled oscillator comprising:

an inductor-capacitor (LC) tank adapted to receive a first voltage;

at least one varactor connected in parallel with said LC tank and adapted to receive a second voltage;

an output node connected to said LC tank and said at least one varactor for outputting a periodic signal having a frequency that is a function of said first voltage and said second voltage;

a variable resistance e-fuse adapted to apply said second voltage to said at least one varactor; and a controller adapted to program resistance in said variable resistance e-fuse, when said frequency is outside a predetermined frequency range, so as to selectively adjust said second voltage, so as to adjust capacitance of said at least one varactor, and further so as to bring said frequency of said periodic signal to within said predetermined frequency range.

11. The design structure according to claim 10, wherein said design structure comprises a netlist.

12. The design structure according to claim 10, wherein said design structure resides on storage medium as a data format used for the exchange of layout data of integrated circuits.

13. The design structure according to claim 10, wherein said voltage controlled oscillator further comprises:

a period detector adapted to determine a period of said periodic signal and to convert said period into an output voltage; and a plurality of voltage comparators adapted to determine if said output voltage is within a predetermined voltage range, and wherein said controller is in communication with said plurality of comparators and is adapted to program said resistance to selectively adjust said second voltage, when said output voltage is outside said predetermined voltage range, so as to bring said frequency to within said predetermined frequency range.

14. A voltage controlled oscillator comprising:

an inductor-capacitor (LC) tank adapted to receive a first voltage;

at least one varactor connected in parallel with said LC tank and adapted to receive a second voltage;

an output node connected to said LC tank and said at least one varactor for outputting a periodic signal having a frequency that is a function of said first voltage and said second voltage;

a variable resistance e-fuse adapted to apply said second voltage to said at least one varactor; and a controller adapted to program resistance in said variable resistance e-fuse, when said frequency is outside a predetermined frequency range, so as to selectively adjust said second voltage, so as to adjust capacitance of said at least one varactor, and further so as to bring said frequency of said periodic signal to within said predetermined frequency range, further comprising:

a period detector adapted to determine a period of said periodic signal and to convert said period into an output voltage; and a plurality of voltage comparators adapted to determine if said output voltage is within a predetermined voltage range, wherein said controller is in communication with said plurality of comparators and is adapted to program said resistance to selectively adjust said second voltage, when said output voltage is outside said predetermined voltage range, so as to bring said frequency to within said predetermined frequency range.

15. The voltage controlled oscillator according to claim 14, wherein said controller is adapted to selectively increase said resistance so as to increase said second voltage in order to decrease said capacitance and, thereby increase said frequency, when said output voltage is higher than said predetermined voltage range, and wherein said controller is further adapted to selectively decrease said resistance so as to decrease said second voltage in order to increase said capacitance and, thereby decrease said frequency, when said output voltage is lower than said predetermined voltage range.

16. The voltage controlled oscillator according to claim 14, wherein said variable resistance e-fuse comprises:

a conductor;

a plurality of series connected resistors;

a plurality of contacts on said conductor connected to said plurality of said series connected resistors;

a first sensing node and a second sensing node on opposite ends of said the series connected resistors, wherein said first said sensing node is electrically connected to said at least one varactor for applying said second voltage to said at least one varactor and said second sensing node is electrically connected to ground; and a first programming node and a second programming node on opposite ends of said conductor, and wherein said controller is adapted to control current flow through said conductor between said first programming node and said second programming node such that said contacts one of become opens in sequence to increase said resistance and revert back to shorts in sequence to decrease said resistance.

17. The voltage controlled oscillator according to claim 16, wherein said resistors are all equal in size.

18. The voltage controlled oscillator according claim 16, further comprising a plurality of said variable resistance e-fuses connected in series, wherein all of said resistors in any given variable resistance e-fuse are equal in size and wherein said resistors on adjacent variable resistance e-fuses are progressively smaller in size so as to allow for fine tuning of said frequency.

19. The voltage controlled oscillator according to claim 14, further comprising a first current source for generating said second voltage and a second current source different from said first current source for programming said resistance.

20. The voltage controlled oscillator according to claim 14, further comprising an amplifier electrically connected between said varactor and said control loop so as to magnify said periodic signal.

* * * * *